US012681524B2

(12) United States Patent
Cho et al.

(10) Patent No.: US 12,681,524 B2
(45) Date of Patent: Jul. 14, 2026

(54) ADAPTIVE CLOCK GATING FOR IMPROVING WEAR OUT-INDUCED DUTY CYCLE SHIFT IN COMPUTER CLOCK NETWORK

(71) Applicant: Intel Corporation, Santa Clara, CA (US)

(72) Inventors: Minki Cho, Portland, OR (US); Balkaran Gill, Cornelius, OR (US); Anisur Rahman, Beaverton, OR (US); Ketul B. Sutaria, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 17/971,619

(22) Filed: Oct. 23, 2022

(65) Prior Publication Data

US 2024/0137016 A1    Apr. 25, 2024
US 2024/0235545 A9    Jul. 11, 2024

(51) Int. Cl.
*G06F 1/04*      (2006.01)
*G06F 1/08*      (2006.01)
*H03K 7/08*      (2006.01)

(52) U.S. Cl.
CPC .................. *G06F 1/04* (2013.01); *G06F 1/08* (2013.01); *H03K 7/08* (2013.01)

(58) Field of Classification Search
CPC ........ H03K 7/08; H03K 19/0016; G06F 1/04; G06F 1/08; G06F 1/3237
See application file for complete search history.

(56) References Cited

U.S. PATENT DOCUMENTS

| | | | | |
|---|---|---|---|---|
| 7,587,686 B1* | 9/2009 | Schleicher, II | ....... | G06F 30/327 |
| | | | | 716/108 |
| 11,689,203 B1* | 6/2023 | Oruganti | ............ | H03K 19/1737 |
| | | | | 326/93 |
| 2013/0191677 A1* | 7/2013 | Ziesler | ................... | G06F 1/3237 |
| | | | | 327/175 |
| 2022/0166427 A1* | 5/2022 | Hwang | .............. | H03K 19/0016 |
| 2023/0038670 A1* | 2/2023 | Narasimhan | .............. | G06F 1/10 |

OTHER PUBLICATIONS

Li, et al., "Deterministic clock gating for microprocessor power reduction," The Ninth International Symposium on High-Performance Computer Architecture, 2003. HPCA-9 2003. Proceedings., Anaheim, CA, USA, (2003) pp. 113-122.
Cheng et al., "A High Linearity, Fast-Locking Pulsewidth Control Loop With Digitally Programmable Duty Cycle Correction for Wide Range Operation," IEEE Journal of Solid-State Circuits, (2008) 43(2):399-413.
Wang, et al., "Duty-cycle shift under asymmetric BTI aging: A simple characterization method and its application to SRAM timing," 2013 IEEE International Reliability Physics Symposium (IRPS), Monterey, CA, USA, (2013) pp. 4A.5.1-4A.5.5.
Mansuri et al., "An on-die all-digital delay measurement circuit with 250fs accuracy," 2012 Symposium on VLSI Circuits (VLSIC), Honolulu, HI, USA, (2012) pp. 98-99.

* cited by examiner

*Primary Examiner* — Patrick O Neill
(74) *Attorney, Agent, or Firm* — Gray Ice Higdon, PLLC

(57) ABSTRACT

This disclosure describes systems, methods, and devices related to clock gating. A device may detect that gating of a local clock of a computer core is enabled; detect, based on the detection that the gating is enabled, that a clock gating condition for the local clock is satisfied; and set a clock gating polarity of the local clock based on the detection that the clock gating condition for the local clock is satisfied.

20 Claims, 8 Drawing Sheets

700

DETECT THAT GATING OF A LOCAL CLOCK IS ENABLED — 702

DETECT, BASED ON THE GATING BEING ENABLED, THAT
A CLOCK GATING CONDITION FOR THE LOCAL CLOCK IS
SATISFIED — 704

SET A CLOCK GATING POLARITY OF THE LOCAL CLOCK
BASED ON THE DETECTION THAT THE CLOCK GATING
CONDITION FOR THE LOCAL CLOCK IS SATISFIED — 706

ADAPTIVE CLOCK GATING FOR IMPROVING WEAR OUT-INDUCED DUTY CYCLE SHIFT IN COMPUTER CLOCK NETWORK

TECHNICAL FIELD

This disclosure generally relates to devices, systems, and methods for clock gating and, more particularly, to adaptive clock gating to address clock network duty cycle shifts.

BACKGROUND

Some computer hardware relies on both rising and falling edges of a clock to generate internal timing signals, so the hardware performance is based on any change in a clock duty cycle. As hardware ages, clock gating can cause symmetric degradation of transistors in a local clock network, shifting the duty cycle of the clock signal, and resulting in synchronization issues and hardware malfunction.

DETAILED DESCRIPTION

Figure 1:
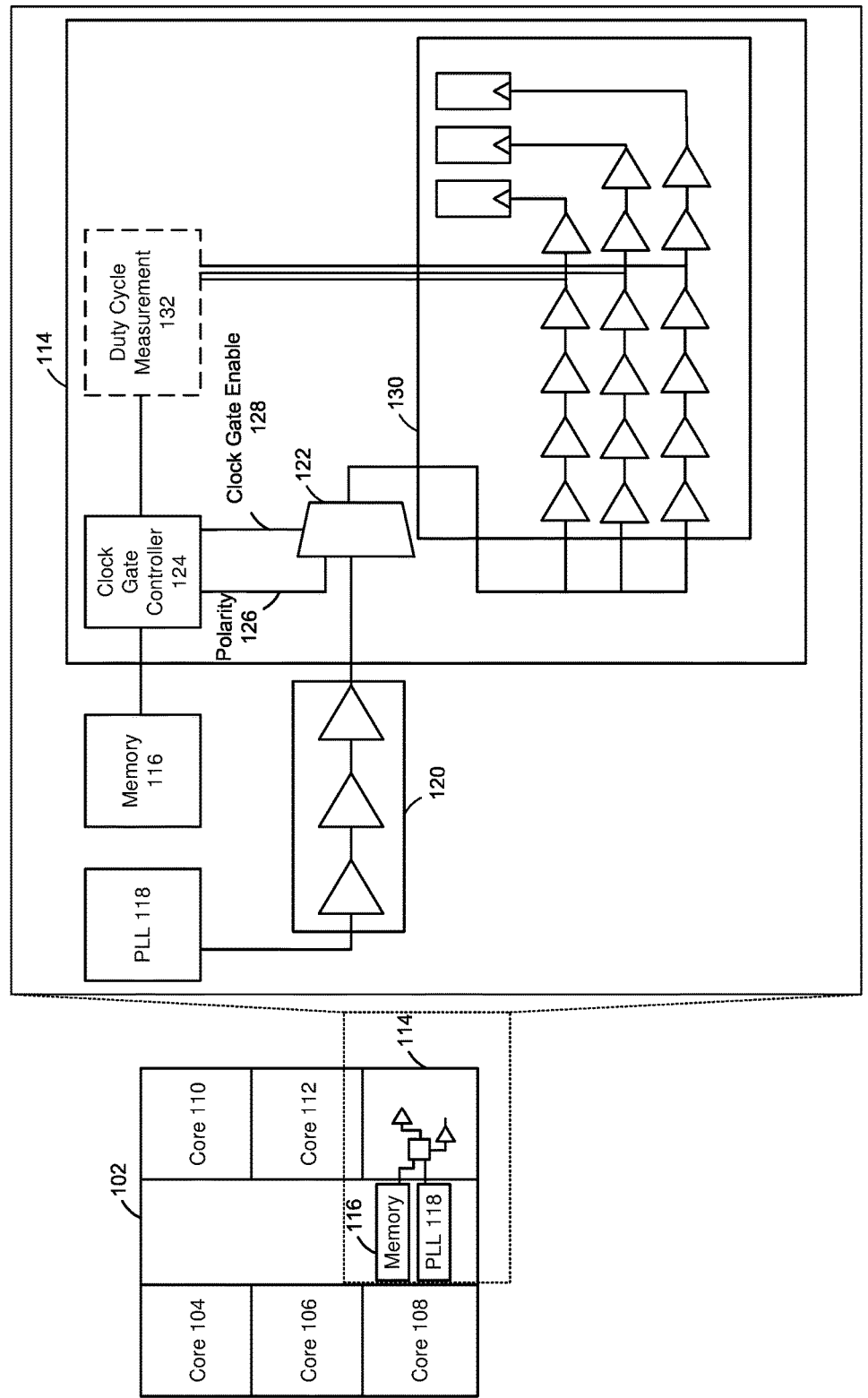
FIG. 1 is an example system with a local clock gating architecture, according to some example embodiments of the present disclosure.

The following description and the drawings sufficiently illustrate specific embodiments to enable those skilled in the art to practice them. Other embodiments may incorporate structural, logical, electrical, process, algorithm, and other changes. Portions and features of some embodiments may be included in, or substituted for, those of other embodiments. Embodiments set forth in the claims encompass all available equivalents of those claims.

In synchronous designs, the clock is the most critical signal for sampling data periodically across entire systems. Clock power is significant portion (e.g., greater than 30%) of total power in a CPU/GPU. To reduce power consumption, a clock gating technique to stop the clock from toggling may implemented (e.g., across IoT applications to high-end processors). Clock gating refers to a technique for reducing dynamic power dissipation by, for example, removing a clock signal when the circuit is not in use.

As a chip ages, a conventional clock gating technique can cause asymmetric degradation of transistors in the local clock network. The asymmetric degradation shifts the duty cycle of the clock signal, which is a critical metric for signal integrity. Signal integrity distortion can cause synchronization issues, resulting in chip malfunction.

Duty cycle correction techniques may be used with clock sources such as phase lock loop (PLL) and digital control oscillator (DC0) to provide a reliable clock signal. Existing duty cycle correction circuits primarily focus on the duty cycle of the clock in the global clock network, which is before a clock gating cell. However, the duty cycle shift in local clock network due to the asymmetric aging cannot be adjusted efficiently with existing correction methods. Also, there is no existing solution to adjust the duty cycle of local clock network using adaptive clocking.

Existing duty cycle correction circuits perform based on the global clock. Thus, current solutions cannot effectively adjust the duty cycle of local clock that drives system performance. Even if the clock signal in the global network maintains a required duty cycle, the duty cycle of leaf clocks in the local clock network cannot be guaranteed to be a good condition due to different clock gating activity, which results in diverse shifts in duty cycle. Another disadvantage of existing techniques is the significant area and power overhead as well as complicated feedback control to manage the duty cycle in the multiple local clock nodes.

In one or more embodiments, the present disclosure uses the asymmetric stress properties of clock gating to mitigate aging/wear out induced duty cycle shift in a CPU. Also, techniques of the present disclosure will result in extending the lifetime of products and/or running products at higher performance during the committed warranty period. The enhanced techniques herein will optimize performance versus reliability in-field using telemetry applications.

In one or more embodiments, the present disclosure provides an adaptive clock gating method that corrects duty cycle in local clock networks. The duty cycle shift due to asymmetric stress from clock gating is adjusted by applying the optimal polarity of clock gating, which distributes the stress in the devices on the clock network. The optimal polarity of clock gating may be selected based on a duty cycle measurement in the adaptive scheme or may be preset in the proactive scheme (e.g., based on an expiration timer or based on a gate event).

In one or more embodiments, the present disclosure using the proposed adaptive clock gating will improve the duty cycle in the clock network. Adaptive clock gating achieves about 50% of duty cycle over the lifetime compared with one polarity clock gating case. Also, other duty cycle-sensitive systems such as SRAM read/write circuits will get benefit by maintaining the target duty cycle by balancing stress on the device. The present disclosure can apply to high-speed synchronous circuits, e.g., critical paths, often using level sensitive latch as sequencing elements, which are especially vulnerable to timing failure due to duty cycle aging.

In one or more embodiments, the present disclosure provides multiple solutions to the duty cycle problem. One solution is to switch the clock gating polarity (e.g., from 0 to 1 or 1 to 0) every gate event. Another solution is to switch the clock gating polarity after a preset timer expires. Another solution is to measure the duty cycle in real-time and switch the clock gating polarity based on the real-time duty cycle measurement (e.g., based on whether the duty cycle measurement is above or below a threshold amount).

The above descriptions are for purposes of illustration and are not meant to be limiting. Numerous other examples, configurations, processes, algorithms, etc., may exist, some of which are described in greater detail below. Example embodiments will now be described with reference to the accompanying figures.

FIG. 1 is an example system 100 with a local clock gating architecture, according to some example embodiments of the present disclosure.

Referring to FIG. 1, a chip 102 may include cores (e.g., core 104, core 106, core 108, core 110, core 112, core 114), memory 116, and a phase lock loop (PLL) 118. FIG. 1 shows the memory, PLL 118, and the core 114 in more detail. The PLL 118 generates a signal related to a phase of an input signal, and that signal feeds a global clock network 120. The output of the global clock network 120 may be input to a gate 122 of the core 114. The core 114 also may include a clock gate controller 124 to set a polarity 126 to input to the gate 122, and a clock gate enable signal 128 to input to the gate 122. The output of the gate 122 may be input to a local clock network 130 of the core 114, which, optionally, may be sampled by a duty cycle measurement device 132. The clock gate controller 124 optionally may use the duty cycle measured by the duty cycle measurement device 132 to set the polarity 126.

In one or more embodiments, depending on the measured duty cycle, the clock gate controller 124 may determine the optimum polarity 126 for the next clock gating. The clock gate controller 124 may be integrated in a local controller or operating system (OS) level. For ungated clock duration or system idle/off mode, the next polarity will be stored in the memory 116. Two strategies for using adaptive clock gating include a proactive scheme as shown in FIG. 2, and an adaptive scheme as shown in FIG. 3.

Figure 2:
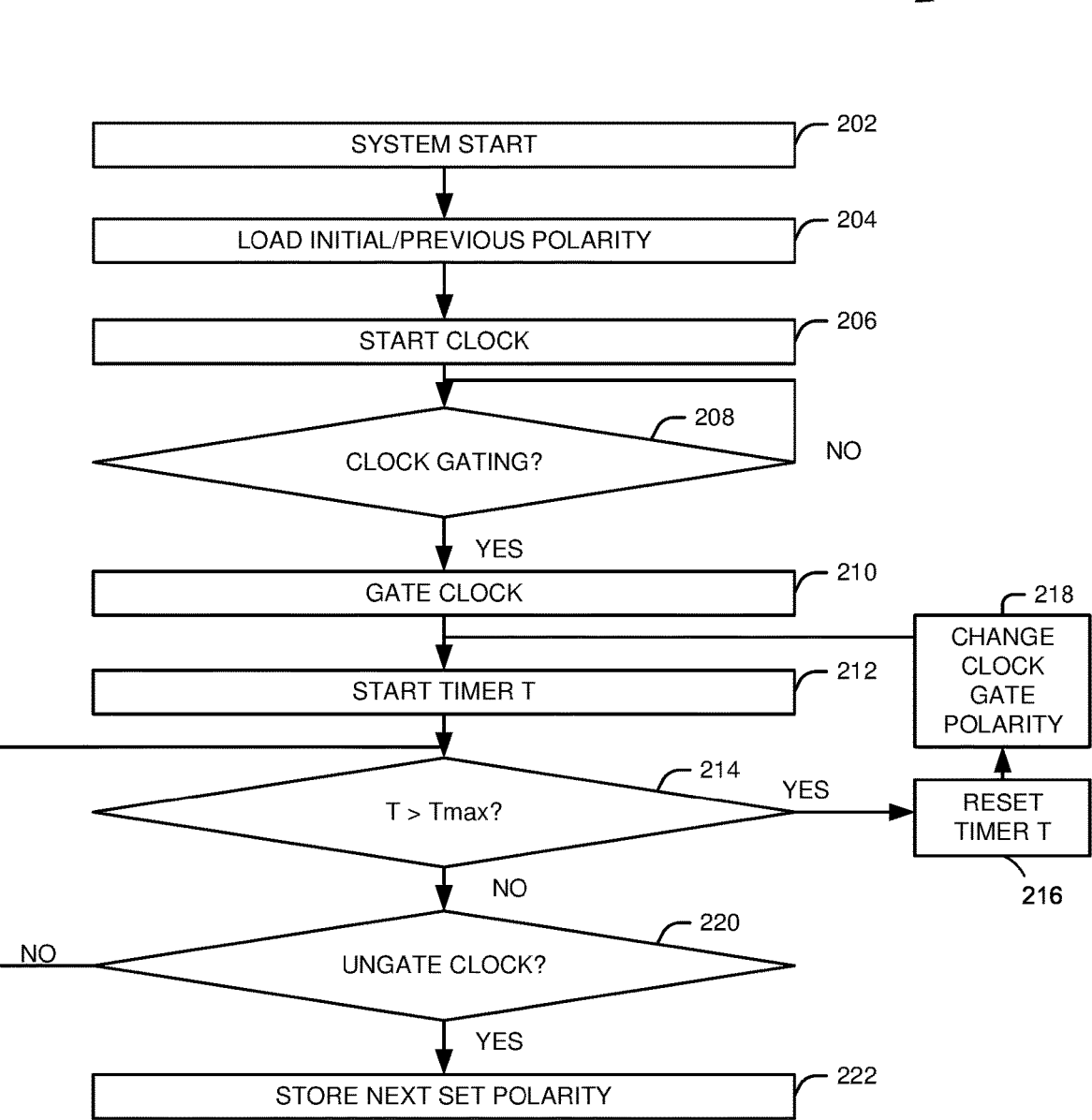
FIG. 2 illustrates a flow diagram of an illustrative process for proactive local clock gating, in accordance with one or more example embodiments of the present disclosure.
Figure 3:
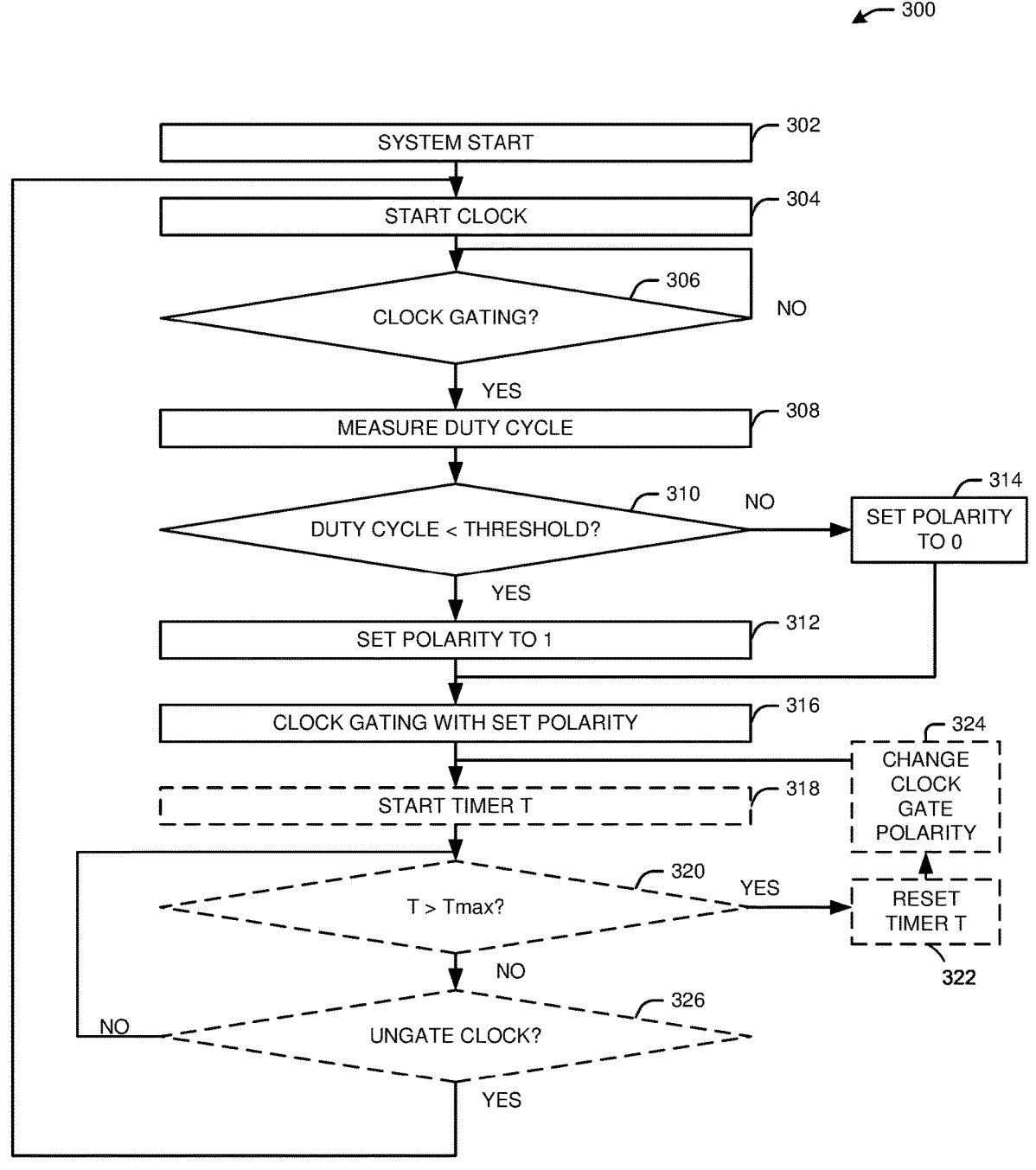
FIG. 3 illustrates a flow diagram of an illustrative process for adaptive local clock gating, in accordance with one or more example embodiments of the present disclosure.

FIG. 2 illustrates a flow diagram of an illustrative process 200 for proactive local clock gating, in accordance with one or more example embodiments of the present disclosure.

Referring to FIG. 2, at block 202, the system 100 of FIG. 1 may start (e.g., receiving outputs from the PLL 118 of FIG. 1). At block 204, the system 100 may load an initial or previous polarity (e.g., from the memory 116 of FIG. 1). At block 206, the system 100 may start a clock (e.g., the local clock network 130 of FIG. 1). At block 208, the system 100 may determine whether there is clock gating at the local clock. If not, the system may continue to repeat the assessment until clock gating is detected. At block 210, the system 100 may gate the clock, and at block 212, the system 100 may start a timer T. When the timer has expired (e.g., T>Tmax), at block 216 the system 100 may reset the timer T, and at block 218 may change the clock gate polarity (e.g., using the clock gate controller 124 of FIG. 1). When the timer T has not yet expired, at block 220 the system 100 may determine whether the clock has been ungated. If not, the system 100 may return to block 214. If the clock has been ungated, at block 222 the system 100 may store the next polarity (e.g., in the memory 116).

Figure 6:
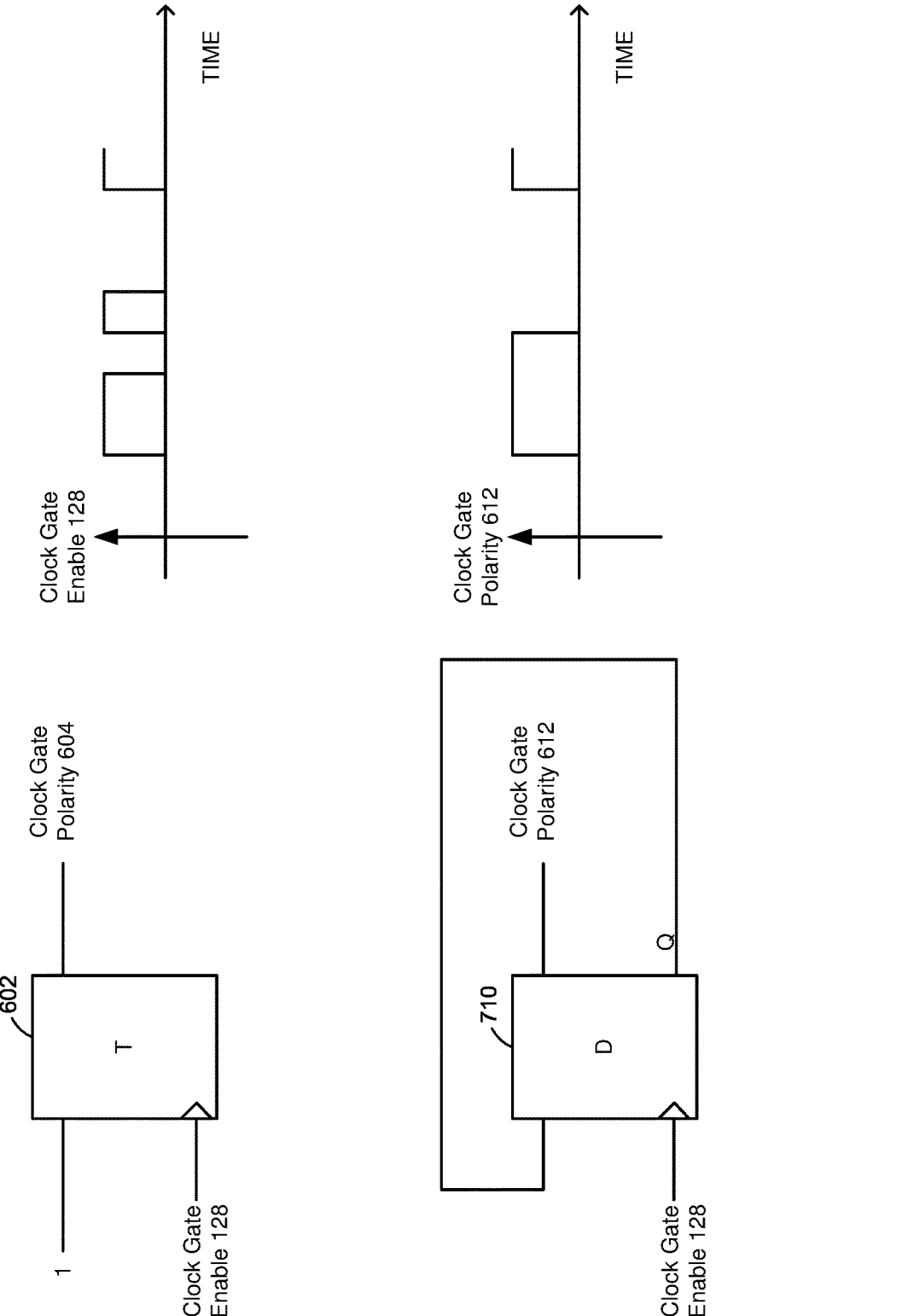
FIG. 6 shows an example polarity generation for the proactive local clock gating of FIG. 2, according to some example embodiments of the present disclosure.

In one or more embodiments, the proactive clock gating process 200 selects alternative polarity for the clock gating at block 218 without monitoring the duty cycle. For example, at the first clock gate event, a polarity of "0" is used, then at next clock gate event, a polarity of "1" is used. A proposed hardware structure is implemented with a single T, or D flop (e.g., as shown in FIG. 6). Duty cycle degradations from respective polarities naturally cancel out over time, resulting in practically zero aging without any need for duty cycle measurement circuit.

In one or more embodiments, during a device characterization process related to the process 200, the system 100 may perform a device characterization and set a maximum polarity holding period (e.g., Tmax used at block 214). In this manner, the time period after which the polarity is switched may be set by the system 100.

FIG. 3 illustrates a flow diagram of an illustrative process 300 for adaptive local clock gating, in accordance with one or more example embodiments of the present disclosure.

Referring to FIG. 3, at block 302 the system 100 of FIG. 1 may start (e.g., receiving outputs from the PLL 118 of FIG. 1). At block 304, the system 100 may start a clock (e.g., the local clock network 130 of FIG. 1). At block 306, the system 100 may determine whether there is clock gating detected. When clock gating is not detected, the process 300 may repeat until clock gating is detected. When clock gating is detected at block 308 the system 100 may measure a duty cycle (e.g., using the duty cycle measurement device 132 of FIG. 1) of the clock signal. If the duty cycle is above a threshold (e.g., 50%), at block 314 the system 100 may set the polarity to 0 (e.g., using the clock gate controller 124 of FIG. 1). When the duty cycle is below the threshold, at block 312 the system 100 may set the polarity to 1 (e.g., using the clock gate controller 124 of FIG. 1). Based on the set polarity, the system 100 may perform clock gating with the set polarity for the clock.

Still referring to FIG. 1, optionally, the system 100 may use a timer in combination with the adaptive mode. At block 318, the system 100 may start a timer T, and when the timer exceeds the maximum polarity holding period Tmax at block 320, the system 100 optionally may reset the timer T at block 322, and optionally may change the clock gate polarity at block 324. When the timer has not exceeded Tmax, at block 320 the system 100 may determine whether the clock has been ungated. If not, the process 300 may return to block 320. If so, the process 300 may return to block 304.

In one or more embodiments, the process 300 evaluates a clock duty cycle and provides the duty cycle to a local controller or OS so that the clock gate controller 124 may determine the optimal polarity for the next clock gating. To perform a duty cycle measurement, an asynchronous sampling method may be used and measured on test-chip silicon. Based on the test, while the duty cycle with DC0 stress increases, the duty cycle with DC1 stress decreases. Two different polarities were applied in the testing (e.g., DC1, then DC0) back-to-back, and the duty cycle returned to close to the initial duty cycle. With the adaptive clock gating method, the duty cycle may be adjusted to about 50% of duty cycle during the measurement regardless of the initial duty cycle.

Figure 4:
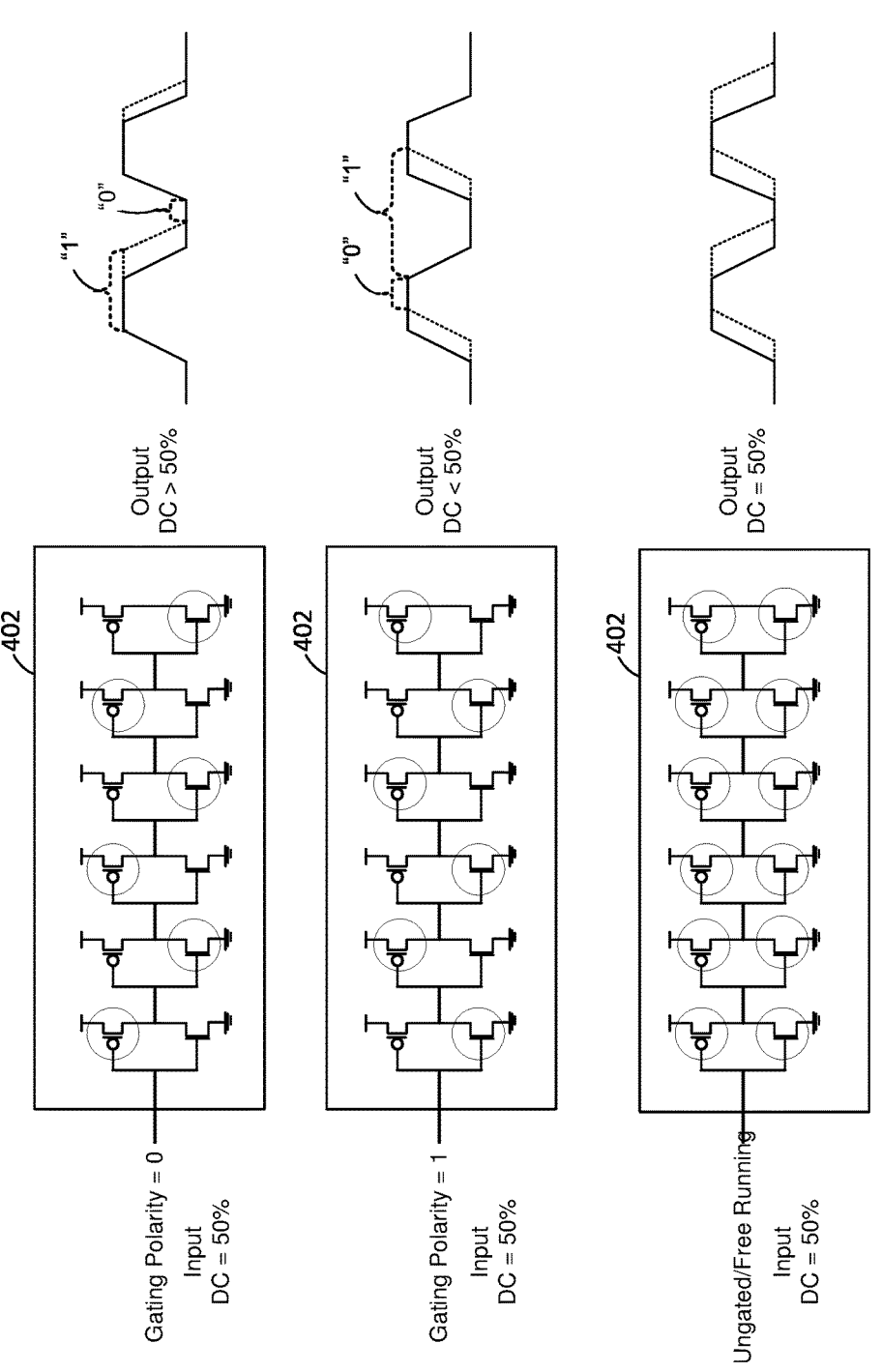
FIG. 4 shows examples of impact of aging on a clock duty cycle, according to some example embodiments of the present disclosure.

FIG. 4 shows examples of impact of aging on a clock duty cycle, according to some example embodiments of the present disclosure.

Referring to FIG. 4, when a gating polarity of 0 is input to a local clock network 402 with an input duty cycle of 50%, the output duty cycle may be greater than 50%. The aging effect of the duty cycle may affect only the falling transition (e.g., from 1 to 0) as shown, so the duty cycle output may increase respective of the input duty cycle.

Still referring to FIG. 4, when a gating polarity of 0 is input to the local clock network 404 with an input duty cycle of 50%, the output duty cycle may be less than the input duty cycle. The aging effect of the duty cycle may affect only the rising transition (e.g., from 0 to 1) as shown, so the duty cycle output may decrease respective of the input duty cycle.

Still referring to FIG. 4, when an ungated/free running polarity is input to the local clock network 404 with an input duty cycle of 50%, the output duty cycle may be the same as the input duty cycle because both the falling and rising transitions may be affected symmetrically, resulting in no change in the output duty cycle.

In a conventional clock gating scheme, due to asymmetric aging of the local clock network 402, the duty cycle may shift over time as shown with the gating polarity of 0 or 1 as inputs. At different operating voltages, the degree of duty cycle shift can vary significantly. Conventional clock gating uses the one kind of polarity which is usually "0." The clock gating with "0" polarity (DC 0) degrades the PMOS in odd stages and NMOS in even stages (e.g., the PMOS and NMOS shown in the local clock network 402). After continued clock gating, the duty cycle of a clock signal continues to increase. For clock gating with "1" (DC 1) degrades the NMOS in odd stages and PMOS in even stages, which results in the duty cycle decrease. With no clock gating, the duty cycle will experience less shift as all devices experience aging. However, with AC stress (no clock gating), clock power consumption increases significantly.

Figure 5:
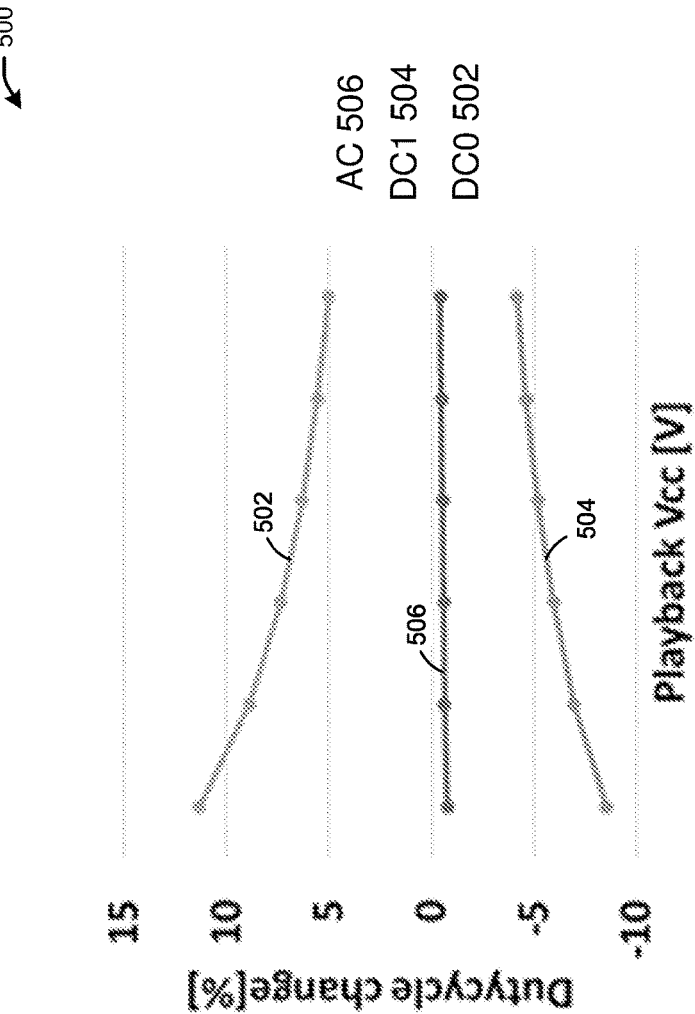
FIG. 5 shows a graph showing simulated results of clock duty cycle changes, according to some example embodiments of the present disclosure.

FIG. 5 shows a graph 500 showing simulated results of clock duty cycle changes, according to some example embodiments of the present disclosure.

Referring to FIG. 5, the graph 500 shows the percentage duty cycle change based on the playback voltage and polarity (e.g., DC0 502, DC1 504, and AC 506). At the low voltage, duty cycle changes up to 12% with DC1 504 stress. While DC0 502, stress increases the duty cycle, and DC1 504 stress decreases duty cycle due to asymmetric aging.

FIG. 6 shows an example polarity generation for the proactive local clock gating of FIG. 2, according to some example embodiments of the present disclosure.

Referring to FIG. 6, a proposed hardware structure for the proactive gating process of FIG. 2 may be implemented with a single T flip flop 602 that may have a polarity input of 1 and the clock gate enable signal 128 of FIG. 1. The T flip flop 602 output may be a clock gate polarity 604. Alternatively, a D flip flop 610 may be used, with the clock gate enable signal 128 as an input, the Q output being an input, and a clock gate polarity 612 as an output. As shown in FIG. 6, duty cycle degradations from respective polarities naturally cancel out over time, resulting in practically zero aging without any need for the duty cycle measurement device 132 of FIG. 1. In this manner, the proactive gating process of FIG. 2 can minimize the effects of aging on the duty cycle.

Figure 7:
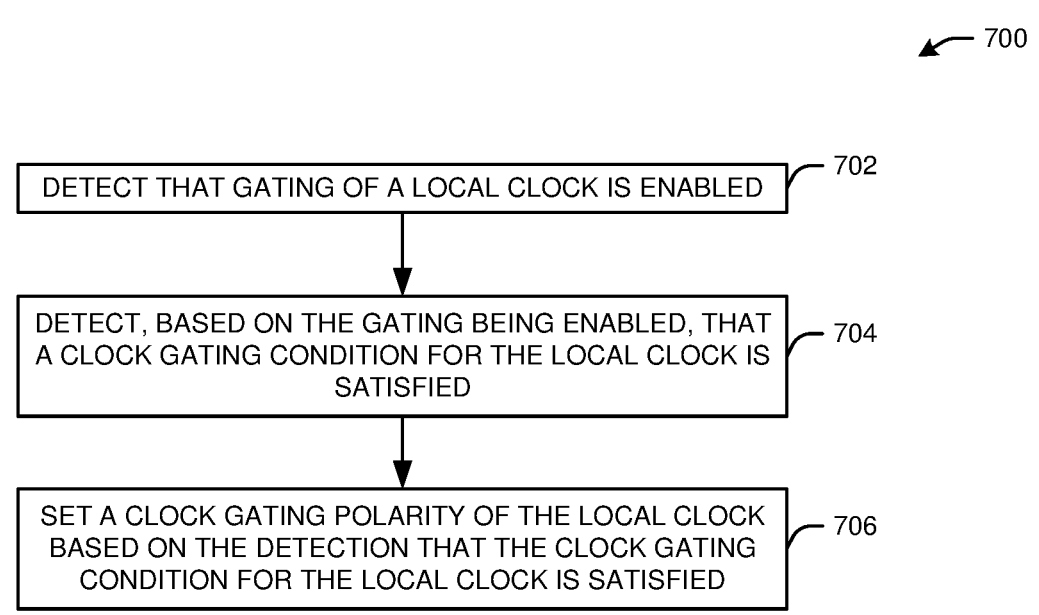
FIG. 7 illustrates a flow diagram of an illustrative process for local clock gating, in accordance with one or more example embodiments of the present disclosure.

FIG. 7 illustrates a flow diagram of an illustrative process 700 for local clock gating, in accordance with one or more example embodiments of the present disclosure.

At block 702, a device (e.g., the clock gate controller 124 of FIG. 1, the clock gating device 819 of FIG. 8) may detect that gating of a local clock (e.g., the local clock network 130 of FIG. 1) of a CPU core (e.g., the core 114 of FIG. 1) is enabled (e.g., the clock gate enable signal 128 is active).

At block 704, based on the clock gating being enabled for the local clock, the device may detect that a clock gating condition for the local clock is satisfied. Satisfaction of the clock gating condition may include detecting a clock gating event, determining that a timer set by the device has exceeded a maximum polarity holding time (e.g., Tmax set by the device), and/or that a measured duty cycle of the local clock is above or below a duty cycle threshold.

At block 706, the device may set a clock gating polarity of the local clock based on the detection that the clock gating condition for the local clock is satisfied. When the condition is detection of any clock gating event, the device may switch the polarity of the local clock from its current polarity to a different polarity (e.g., from 0 to 1 or from 1 to 0). When a duty cycle measurement is detected, the polarity may be set to a 0 or a 1 based on whether the duty cycle measurement is above or below a duty cycle threshold (e.g., as shown in FIG. 3). Whether or not a duty cycle measurement is detected, the polarity may be set based on whether a timer set by the device has exceed the maximum polarity holding time (e.g., FIG. 2 or FIG. 3).

It is understood that the above descriptions are for purposes of illustration and are not meant to be limiting.

Figure 8:
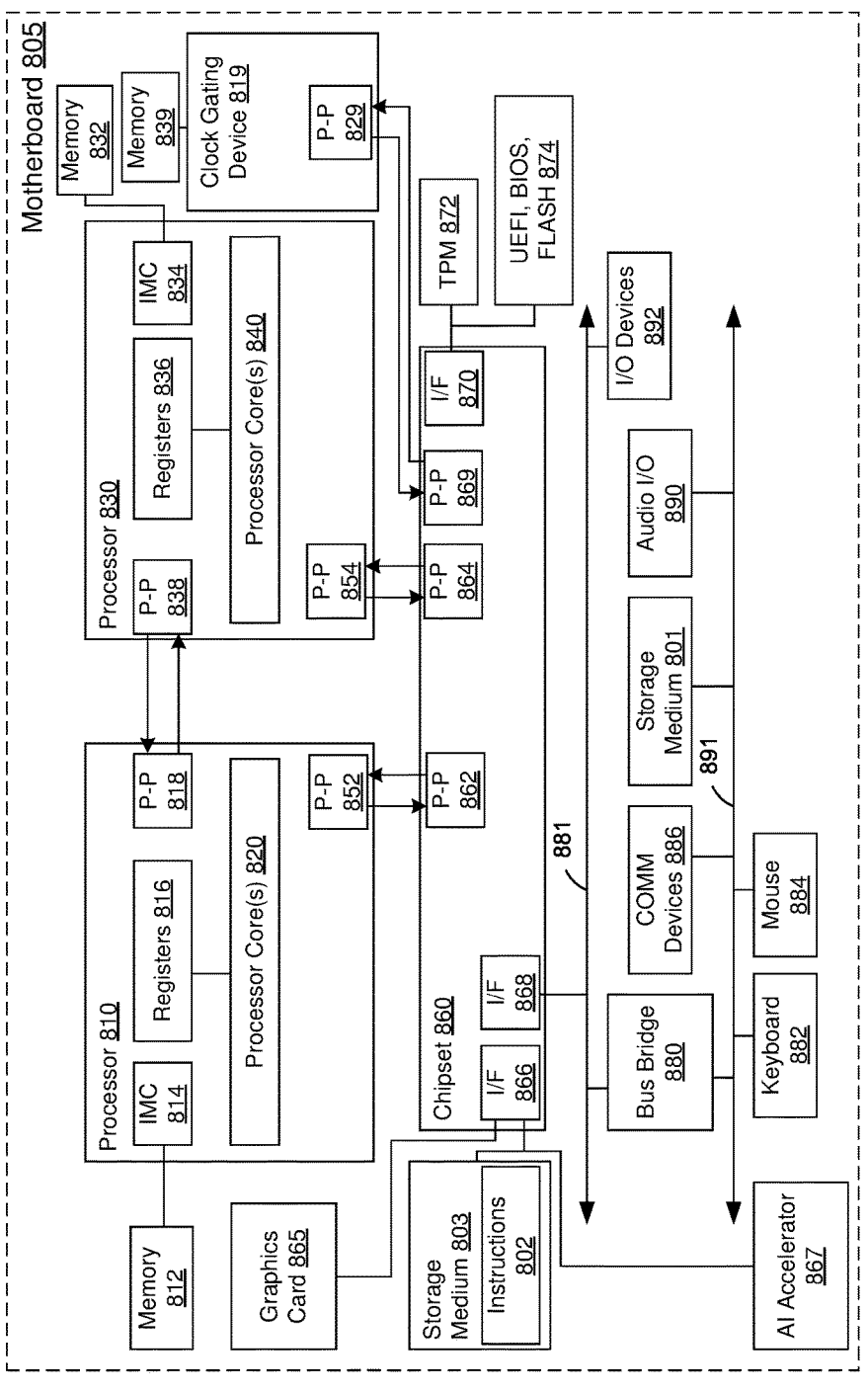
FIG. 8 illustrates an embodiment of an exemplary system, in accordance with one or more example embodiments of the present disclosure.

FIG. 8 illustrates an embodiment of an exemplary system 800, in accordance with one or more example embodiments of the present disclosure.

In various embodiments, the computing system 800 may comprise or be implemented as part of an electronic device.

In some embodiments, the computing system 800 may be representative, for example, of a computer system that implements one or more components and/or performs steps of the processes of FIGS. 1-3 and 7.

The embodiments are not limited in this context. More generally, the computing system 800 is configured to implement all logic, systems, processes, logic flows, methods, equations, apparatuses, and functionality described herein and with reference to FIGS. 1-3 and 7.

The system 600 may be a computer system with multiple processor cores such as a distributed computing system, supercomputer, high-performance computing system, computing cluster, mainframe computer, mini-computer, client-server system, personal computer (PC), workstation, server, portable computer, laptop computer, tablet computer, a handheld device such as a personal digital assistant (PDA), or other devices for processing, displaying, or transmitting information. Similar embodiments may comprise, e.g., entertainment devices such as a portable music player or a portable video player, a smart phone or other cellular phones, a telephone, a digital video camera, a digital still camera, an external storage device, or the like. Further embodiments implement larger scale server configurations. In other embodiments, the system 600 may have a single processor with one core or more than one processor. Note that the term "processor" refers to a processor with a single core or a processor package with multiple processor cores.

In at least one embodiment, the computing system 800 is representative of one or more components of FIG. 1. More generally, the computing system 800 is configured to implement all logic, systems, processes, logic flows, methods, apparatuses, and functionality described herein with reference to the above figures.

As used in this application, the terms "system" and "component" and "module" are intended to refer to a computer-related entity, either hardware, a combination of hardware and software, software, or software in execution, examples of which are provided by the exemplary system 800. For example, a component can be, but is not limited to being, a process running on a processor, a processor, a hard disk drive, multiple storage drives (of optical and/or magnetic storage medium), an object, an executable, a thread of execution, a program, and/or a computer.

By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

As shown in this figure, system 800 comprises a motherboard 805 for mounting platform components. The motherboard 805 is a point-to-point interconnect platform that includes a processor 810, a processor 830 coupled via a point-to-point interconnects as an Ultra Path Interconnect (UPI), and a clock gating device 819 (e.g., capable of performing the functions of FIGS. 1-3 and 7). In other embodiments, the system 800 may be of another bus architecture, such as a multi-drop bus. Furthermore, each of processors 810 and 830 may be processor packages with multiple processor cores. As an example, processors 810 and 830 are shown to include processor core(s) 820 and 840, respectively. While the system 800 is an example of a two-socket (2S) platform, other embodiments may include more than two sockets or one socket. For example, some embodiments may include a four-socket (4S) platform or an eight-socket (8S) platform. Each socket is a mount for a processor and may have a socket identifier. Note that the term platform refers to the motherboard with certain components mounted such as the processors 810 and the chipset 860. Some platforms may include additional components and some platforms may only include sockets to mount the processors and/or the chipset.

The processors 810 and 830 can be any of various commercially available processors, including without limitation an Intel® Celeron®, Core®, Core (2) Duo®, Itanium®, Pentium®, Xeon®, and XScale® processors; AMD® Athlon®, Duron® and Opteron® processors; ARM® application, embedded and secure processors; IBM® and Motorola® DragonBall® and PowerPC® processors; IBM and Sony® Cell processors; and similar processors. Dual microprocessors, multi-core processors, and other multi-processor architectures may also be employed as the processors 810, and 830.

The processor 810 includes an integrated memory controller (IMC) 814 and point-to-point (P-P) interfaces 818 and 852. Similarly, the processor 830 includes an IMC 834 and P-P interfaces 838 and 854. The WIC's 814 and 834 couple the processors 810 and 830, respectively, to respective memories, a memory 812 and a memory 832. The memories 812 and 832 may be portions of the main memory (e.g., a dynamic random-access memory (DRAM)) for the platform such as double data rate type 3 (DDR3) or type 4 (DDR4) synchronous DRAM (SDRAM). In the present embodiment, the memories 812 and 832 locally attach to the respective processors 810 and 830.

In addition to the processors 810 and 830, the system 800 may include the clock gating device 819. The clock gating device 819 may be connected to chipset 860 by means of P-P interfaces 829 and 869. The clock gating device 819 may also be connected to a memory 839. In some embodiments, the clock gating device 819 may be connected to at least one of the processors 810 and 830. In other embodiments, the memories 812, 832, and 839 may couple with the processor 810 and 830, and the clock gating device 819 via a bus and shared memory hub.

System 800 includes chipset 860 coupled to processors 810 and 830. Furthermore, chipset 860 can be coupled to storage medium 803, for example, via an interface (UF) 866. The I/F 866 may be, for example, a Peripheral Component Interconnect-enhanced (PCI-e). The processors 810, 830, and the clock gating device 819 may access the storage medium 803 through chipset 860.

Storage medium 803 may comprise any non-transitory computer-readable storage medium or machine-readable storage medium, such as an optical, magnetic or semiconductor storage medium. In various embodiments, storage medium 803 may comprise an article of manufacture. In some embodiments, storage medium 803 may store computer-executable instructions, such as computer-executable instructions 802 to implement one or more of processes or operations described herein, (e.g., process 700 of FIG. 7). The storage medium 803 may store computer-executable instructions for any equations depicted above. The storage medium 803 may further store computer-executable instructions for models and/or networks described herein, such as a neural network or the like. Examples of a computer-readable storage medium or machine-readable storage medium may include any tangible media capable of storing electronic data, including volatile memory or non-volatile memory, removable or non-removable memory, erasable or non-erasable memory, writeable or re-writeable memory, and so forth. Examples of computer-executable instructions may include any suitable types of code, such as source code, compiled code, interpreted code, executable code, static code, dynamic code, object-oriented code, visual code, and the like. It should be understood that the embodiments are not limited in this context.

The processor 810 couples to a chipset 860 via P-P interfaces 852 and 862 and the processor 830 couples to a chipset 860 via P-P interfaces 854 and 864. Direct Media Interfaces (DMIs) may couple the P-P interfaces 852 and 862 and the P-P interfaces 854 and 864, respectively. The DMI may be a high-speed interconnect that facilitates, e.g., eight Giga Transfers per second (GT/s) such as DMI 3.0. In other embodiments, the processors 810 and 830 may interconnect via a bus.

The chipset 860 may comprise a controller hub such as a platform controller hub (PCH). The chipset 860 may include a system clock to perform clocking functions and include interfaces for an I/O bus such as a universal serial bus (USB), peripheral component interconnects (PCIs), serial peripheral interconnects (SPIs), integrated interconnects (I2Cs), and the like, to facilitate connection of peripheral devices on the platform. In other embodiments, the chipset 860 may comprise more than one controller hub such as a chipset with a memory controller hub, a graphics controller hub, and an input/output (I/O) controller hub.

In the present embodiment, the chipset 860 couples with a trusted platform module (TPM) 872 and the UEFI, BIOS, Flash component 874 via an interface (I/F) 870. The TPM 872 is a dedicated microcontroller designed to secure hardware by integrating cryptographic keys into devices. The UEFI, BIOS, Flash component 874 may provide pre-boot code.

Furthermore, chipset 860 includes the I/F 866 to couple chipset 860 with a high-performance graphics engine, graphics card 865. In other embodiments, the system 800 may include a flexible display interface (FDI) between the processors 810 and 830 and the chipset 860. The FDI interconnects a graphics processor core in a processor with the chipset 860.

Various I/O devices 892 couple to the bus 881, along with a bus bridge 880 which couples the bus 881 to a second bus 891 and an I/F 868 that connects the bus 881 with the chipset 860. In one embodiment, the second bus 891 may be a low pin count (LPC) bus. Various devices may couple to the second bus 891 including, for example, a keyboard 882, a mouse 884, communication devices 886, a storage medium 801, and an audio I/O 890 (e.g., including one or more microphones).

The artificial intelligence (AI) accelerator 867 may be circuitry arranged to perform computations related to AI. The AI accelerator 867 may be connected to storage medium 803 and chipset 860. The AI accelerator 867 may deliver the processing power and energy efficiency needed to enable abundant-data computing. The AI accelerator 867 is a class of specialized hardware accelerators or computer systems designed to accelerate artificial intelligence and machine learning applications, including artificial neural networks and machine vision. The AI accelerator 867 may be applicable to algorithms for robotics, internet of things, other data-intensive and/or sensor-driven tasks.

Many of the I/O devices 892, communication devices 886, and the storage medium 801 may reside on the motherboard 805 while the keyboard 882 and the mouse 884 may be add-on peripherals. In other embodiments, some or all the I/O devices 892, communication devices 886, and the storage medium 801 are add-on peripherals and do not reside on the motherboard 805.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, yet still co-operate or interact with each other.

In addition, in the foregoing Detailed Description, various features are grouped together in a single example to streamline the disclosure. This method of disclosure is not to be interpreted as reflecting an intention that the claimed examples require more features than are expressly recited in each claim. Rather, as the following claims reflect, the inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

A data processing system suitable for storing and/or executing program code will include at least one processor coupled directly or indirectly to memory elements through a system bus. The memory elements can include local memory employed during actual execution of the program code, bulk storage, and cache memories that provide temporary storage of at least some program code to reduce the number of times code must be retrieved from bulk storage during execution. The term "code" covers a broad range of software components and constructs, including applications, drivers, processes, routines, methods, modules, firmware, microcode, and subprograms. Thus, the term "code" may be used to refer to any collection of instructions that, when executed by a processing system, perform a desired operation or operations.

Logic circuitry, devices, and interfaces herein described may perform functions implemented in hardware and implemented with code executed on one or more processors. Logic circuitry refers to the hardware or the hardware and code that implements one or more logical functions. Circuitry is hardware and may refer to one or more circuits. Each circuit may perform a particular function. A circuit of the circuitry may comprise discrete electrical components interconnected with one or more conductors, an integrated circuit, a chip package, a chipset, memory, or the like. Integrated circuits include circuits created on a substrate such as a silicon wafer and may comprise components. Integrated circuits, processor packages, chip packages, and chipsets may comprise one or more processors.

Processors may receive signals such as instructions and/or data at the input(s) and process the signals to generate at least one output. While executing code, the code changes the physical states and characteristics of transistors that make up a processor pipeline. The physical states of the transistors translate into logical bits of ones and zeros stored in registers within the processor. The processor can transfer the physical states of the transistors into registers and transfer the physical states of the transistors to another storage medium.

A processor may comprise circuits to perform one or more sub-functions implemented to perform the overall function of the processor. One example of a processor is a state machine or an application-specific integrated circuit (ASIC) that includes at least one input and at least one output. A state machine may manipulate the at least one input to generate the at least one output by performing a predetermined series of serial and/or parallel manipulations or transformations on the at least one input.

The logic as described above may be part of the design for an integrated circuit chip. The chip design is created in a graphical computer programming language, and stored in a computer storage medium or data storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a processor board, a server platform, or a motherboard, or (b) an end product.

The word "exemplary" is used herein to mean "serving as an example, instance, or illustration." Any embodiment described herein as "exemplary" is not necessarily to be construed as preferred or advantageous over other embodiments. The terms "computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Some embodiments may be used in conjunction with one or more types of wireless communication signals and/or systems following one or more wireless communication protocols, for example, radio frequency (RF), infrared (IR), frequency-division multiplexing (FDM), orthogonal FDM (OFDM), time-division multiplexing (TDM), time-division multiple access (TDMA), extended TDMA (E-TDMA), general packet radio service (GPRS), extended GPRS, code-division multiple access (CDMA), wideband CDMA (WCDMA), CDMA 2000, single-carrier CDMA, multi-carrier CDMA, multi-carrier modulation (MDM), discrete multi-tone (DMT), Bluetooth®, global positioning system (GPS), Wi-Fi, Wi-Max, ZigBee, ultra-wideband (UWB), global system for mobile communications (GSM), 2G, 2.5G, 3G, 3.5G, 4G, fifth generation (5G) mobile networks, 3GPP, long term evolution (LTE), LTE advanced, enhanced data rates for GSM Evolution (EDGE), or the like. Other embodiments may be used in various other devices, systems, and/or networks.

The following examples pertain to further embodiments.

Example 1 may include an apparatus for clock gating, the apparatus comprising processing circuitry coupled to memory, the processing circuitry configured to: detect that gating of a local clock of a computer core is enabled; detect, based on the detection that the gating is enabled, that a clock gating condition for the local clock is satisfied; and set a clock gating polarity of the local clock based on the detection that the clock gating condition for the local clock is satisfied.

Example 2 may include the apparatus of example 1, wherein to detect that the clock gating condition is satisfied comprises to detect a clock gate event associated with the local clock, and wherein to set the clock gating polarity of the local clock comprises to switch the clock gating polarity from a first polarity to a second polarity different than the first polarity.

Example 3 may include the apparatus of example 2, wherein to detect the clock gate event associated with the local clock is unassociated with measuring a duty cycle of the local clock.

Example 4 may include the apparatus of example 2, wherein the processing circuitry is further configured to: detect a second clock gate event associated with the local clock; and switch the clock gating polarity from the second polarity to the first polarity based on the detection of the second clock gate event.

Example 5 may include the apparatus of example 1, wherein the processing circuitry is further configured to:

start a timer based on the detection that the gating is enabled, wherein to detect that the clock gating condition is satisfied comprises to determine that the timer has exceeded a maximum polarity holding time period, and wherein to set the clock gating polarity of the local clock comprises to switch the clock gating polarity from a first polarity to a second polarity different than the first polarity.

Example 6 may include the apparatus of example 5, wherein the processing circuitry is further configured to: generate an estimate for the maximum polarity holding time period.

Example 7 may include the apparatus of example 5, wherein the processing circuitry is further configured to: reset the timer based on the determination that the timer has exceeded the maximum polarity holding time period.

Example 8 may include the apparatus of example 1, wherein the processing circuitry is further configured to: start a timer based on the detection that the gating is enabled; determine that the timer has not exceeded a maximum polarity holding time period; and determine that the local clock is not ungated.

Example 9 may include the apparatus of example 1, wherein the processing circuitry is further configured to: start a timer based on the detection that the gating is enabled; determine that the timer has not exceeded a maximum polarity holding time period; determine that the local clock is ungated; and store a current polarity of the local clock as a next polarity of the local clock.

Example 10 may include may include the apparatus of example 1, wherein the processing circuitry is further configured to: detect a duty cycle measurement of the local clock, wherein to detect that the clock gating condition is satisfied comprises to determine that the duty cycle measurement is below a duty cycle threshold, and wherein to set the clock gating polarity of the local clock comprises to set the clock gating polarity to 1.

Example 11 may include the apparatus of example 1, wherein the processing circuitry is further configured to: detect a duty cycle measurement of the local clock, wherein to detect that the clock gating condition is satisfied comprises to determine that the duty cycle measurement is above a duty cycle threshold, and wherein to set the clock gating polarity of the local clock comprises to set the clock gating polarity to 0.

Example 12 may include the apparatus of example 1, wherein the processing circuitry is further configured to: detect a duty cycle measurement of the local clock; start a timer based on the detection that the gating is enabled; and determine, when the timer exceeds a maximum polarity holding time period, that the local clock is gated or ungated.

Example 13 may include a non-transitory computer-readable storage medium comprising instructions to cause processing circuitry of a device for clock gating, upon execution of the instructions by the processing circuitry, to: detect that gating of a local clock of a computer core is enabled; detect, based on the detection that the gating is enabled, that a clock gating condition for the local clock is satisfied; and set a clock gating polarity of the local clock based on the detection that the clock gating condition for the local clock is satisfied.

Example 14 may include the non-transitory computer-readable medium of example 13, wherein to detect that the clock gating condition is satisfied comprises to detect a clock gate event associated with the local clock, and wherein to set the clock gating polarity of the local clock comprises to switch the clock gating polarity from a first polarity to a second polarity different than the first polarity.

Example 15 may include the non-transitory computer-readable example of example 13, wherein execution of the instructions further causes the processing circuitry to: start a timer based on the detection that the gating is enabled, wherein to detect that the clock gating condition is satisfied comprises to determine that the timer has exceeded a maximum polarity holding time period, and wherein to set the clock gating polarity of the local clock comprises to switch the clock gating polarity from a first polarity to a second polarity different than the first polarity.

Example 16 may include the non-transitory computer-readable medium of example 13, wherein execution of the instructions further causes the processing circuitry to: detect a duty cycle measurement of the local clock, wherein to detect that the clock gating condition is satisfied comprises to determine that the duty cycle measurement is below a duty cycle threshold, and wherein to set the clock gating polarity of the local clock comprises to set the clock gating polarity to 1.

Example 17 may include the non-transitory computer-readable medium of claim 13, wherein execution of the instructions further causes the processing circuitry to: detect a duty cycle measurement of the local clock, wherein to detect that the clock gating condition is satisfied comprises to determine that the duty cycle measurement is above a duty cycle threshold, and wherein to set the clock gating polarity of the local clock comprises to set the clock gating polarity to 0.

Example 18 may include a method for clock gating, the method comprising: detecting, by processing circuitry of a device, that gating of a local clock of a computer core is enabled; detecting, by the processing circuitry, based on the detection that the gating is enabled, that a clock gating condition for the local clock is satisfied; and setting, by the processing circuitry, a clock gating polarity of the local clock based on the detection that the clock gating condition for the local clock is satisfied.

Example 19 may include the method of example 18, wherein detecting that the clock gating condition is satisfied comprises detecting a clock gate event associated with the local clock, and wherein setting the clock gating polarity of the local clock comprises switching the clock gating polarity from a first polarity to a second polarity different than the first polarity.

Example 20 may include the method of example 18, further comprising: detecting a duty cycle measurement of the local clock, wherein detecting that the clock gating condition is satisfied is based on a comparison of the duty cycle measurement to a duty cycle threshold.

Example 21 may include one or more non-transitory computer-readable media comprising instructions to cause an electronic device, upon execution of the instructions by one or more processors of the electronic device, to perform one or more elements of a method described in or related to any of examples 1-20, or any other method or process described herein.

Example 22 may include an apparatus comprising logic, modules, and/or circuitry to perform one or more elements of a method described in or related to any of examples 1-20, or any other method or process described herein.

Example 23 may include a method, technique, or process as described in or related to any of examples 1-20, or portions or parts thereof.

Embodiments according to the disclosure are in particular disclosed in the attached claims directed to a method, a storage medium, a device and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, may be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that may direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. An apparatus for clock gating, the apparatus comprising processing circuitry coupled to memory, the processing circuitry configured to:

detect that gating of a local clock of a computer core is enabled;

detect, based on the detection that the gating is enabled, that a clock gating condition for the local clock is satisfied; and set a clock gating polarity of the local clock based on the detection that the clock gating condition for the local clock is satisfied.

2. The apparatus of claim 1, wherein to detect that the clock gating condition is satisfied comprises to detect a clock gate event associated with the local clock, and wherein to set the clock gating polarity of the local clock comprises to switch the clock gating polarity from a first polarity to a second polarity different than the first polarity.

3. The apparatus of claim 2, wherein to detect the clock gate event associated with the local clock is unassociated with measuring a duty cycle of the local clock.

4. The apparatus of claim 2, wherein the processing circuitry is further configured to:

detect a second clock gate event associated with the local clock; and switch the clock gating polarity from the second polarity to the first polarity based on the detection of the second clock gate event.

5. The apparatus of claim 1, wherein the processing circuitry is further configured to:

start a timer based on the detection that the gating is enabled, wherein to detect that the clock gating condition is satisfied comprises to determine that the timer has exceeded a maximum polarity holding time period, and wherein to set the clock gating polarity of the local clock comprises to switch the clock gating polarity from a first polarity to a second polarity different than the first polarity.

6. The apparatus of claim 5, wherein the processing circuitry is further configured to:

generate an estimate for the maximum polarity holding time period.

7. The apparatus of claim 5, wherein the processing circuitry is further configured to:

reset the timer based on the determination that the timer has exceeded the maximum polarity holding time period.

8. The apparatus of claim 1, wherein the processing circuitry is further configured to:

start a timer based on the detection that the gating is enabled;

determine that the timer has not exceeded a maximum polarity holding time period; and determine that the local clock is not ungated.

9. The apparatus of claim 1, wherein the processing circuitry is further configured to:

start a timer based on the detection that the gating is enabled;

determine that the timer has not exceeded a maximum polarity holding time period;

determine that the local clock is ungated; and store a current polarity of the local clock as a next polarity of the local clock.

10. The apparatus of claim 1, wherein the processing circuitry is further configured to:

detect a duty cycle measurement of the local clock, wherein to detect that the clock gating condition is satisfied comprises to determine that the duty cycle measurement is below a duty cycle threshold, and wherein to set the clock gating polarity of the local clock comprises to set the clock gating polarity to 1.

11. The apparatus of claim 1, wherein the processing circuitry is further configured to:

detect a duty cycle measurement of the local clock, wherein to detect that the clock gating condition is satisfied comprises to determine that the duty cycle measurement is above a duty cycle threshold, and wherein to set the clock gating polarity of the local clock comprises to set the clock gating polarity to 0.

12. The apparatus of claim 1, wherein the processing circuitry is further configured to:

detect a duty cycle measurement of the local clock;

start a timer based on the detection that the gating is enabled; and determine, when the timer exceeds a maximum polarity holding time period, that the local clock is gated or ungated.

13. A non-transitory computer-readable storage medium comprising instructions to cause processing circuitry of a device for clock gating, upon execution of the instructions by the processing circuitry, to:

detect that gating of a local clock of a computer core is enabled;

detect, based on the detection that the gating is enabled, that a clock gating condition for the local clock is satisfied; and set a clock gating polarity of the local clock based on the detection that the clock gating condition for the local clock is satisfied.

14. The non-transitory computer-readable medium of claim 13, wherein to detect that the clock gating condition is satisfied comprises to detect a clock gate event associated with the local clock, and wherein to set the clock gating polarity of the local clock comprises to switch the clock gating polarity from a first polarity to a second polarity different than the first polarity.

15. The non-transitory computer-readable medium of claim 13, wherein execution of the instructions further causes the processing circuitry to:

start a timer based on the detection that the gating is enabled, wherein to detect that the clock gating condition is satisfied comprises to determine that the timer has exceeded a maximum polarity holding time period, and wherein to set the clock gating polarity of the local clock comprises to switch the clock gating polarity from a first polarity to a second polarity different than the first polarity.

16. The non-transitory computer-readable medium of claim 13, wherein execution of the instructions further causes the processing circuitry to:

detect a duty cycle measurement of the local clock, wherein to detect that the clock gating condition is satisfied comprises to determine that the duty cycle measurement is below a duty cycle threshold, and wherein to set the clock gating polarity of the local clock comprises to set the clock gating polarity to 1.

17. The non-transitory computer-readable medium of claim 13, wherein execution of the instructions further causes the processing circuitry to:

detect a duty cycle measurement of the local clock, wherein to detect that the clock gating condition is satisfied comprises to determine that the duty cycle measurement is above a duty cycle threshold, and wherein to set the clock gating polarity of the local clock comprises to set the clock gating polarity to 0.

18. A method for clock gating, the method comprising:

detecting, by processing circuitry of a device, that gating of a local clock of a computer core is enabled;

detecting, by the processing circuitry, based on the detection that the gating is enabled, that a clock gating condition for the local clock is satisfied; and setting, by the processing circuitry, a clock gating polarity of the local clock based on the detection that the clock gating condition for the local clock is satisfied.

19. The method of claim 18, wherein detecting that the clock gating condition is satisfied comprises detecting a clock gate event associated with the local clock, and wherein setting the clock gating polarity of the local clock comprises switching the clock gating polarity from a first polarity to a second polarity different than the first polarity.

20. The method of claim 18, further comprising:

detecting a duty cycle measurement of the local clock, wherein detecting that the clock gating condition is satisfied is based on a comparison of the duty cycle measurement to a duty cycle threshold.

* * * * *